(12) United States Patent
Zhang et al.

(10) Patent No.: US 11,171,313 B2
(45) Date of Patent: Nov. 9, 2021

(54) INCOHERENT THIN FILM ENCAPSULATION FOR DISPLAY

(71) Applicant: Apple Inc., Cupertino, CA (US)

(72) Inventors: Yifan Zhang, San Carlos, CA (US); Amin Salehi, Raleigh, NC (US); Yun Liu, Sunnyvale, CA (US); Paul S. Drzaic, Morgan Hill, CA (US); Tae-Wook Koh, San Jose, CA (US); Chih Jen Yang, Cupertino, CA (US); Bhadrinarayana Lalgudi Visweswaran, Santa Clara, CA (US); Chieh-Wei Chen, Taichung (TW)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/448,918

(22) Filed: Jun. 21, 2019

(65) Prior Publication Data
US 2020/0099012 A1 Mar. 26, 2020

Related U.S. Application Data

(60) Provisional application No. 62/735,534, filed on Sep. 24, 2018.

(51) Int. Cl.
*H01L 51/52* (2006.01)
*H01L 27/32* (2006.01)

(52) U.S. Cl.
CPC ...... *H01L 51/5281* (2013.01); *H01L 27/3244* (2013.01); *H01L 51/5253* (2013.01); *H01L 2251/5346* (2013.01)

(58) Field of Classification Search
None
See application file for complete search history.

(56) References Cited

U.S. PATENT DOCUMENTS

| | | | | |
|---|---|---|---|---|
| 2005/0068474 | A1* | 3/2005 | Su | H01L 27/322 349/69 |
| 2008/0239488 | A1* | 10/2008 | Asakura | G02B 1/111 359/485.01 |
| 2010/0014163 | A1* | 1/2010 | Morimoto | G02B 1/116 359/585 |
| 2010/0173149 | A1* | 7/2010 | Hung | C03C 17/42 428/336 |
| 2010/0328797 | A1* | 12/2010 | Kim | H05K 9/0096 359/892 |
| 2012/0028009 | A1* | 2/2012 | Gerardin | C03C 17/36 428/212 |
| 2012/0258295 | A1* | 10/2012 | Leyder | G02B 1/10 428/212 |

(Continued)

OTHER PUBLICATIONS

Leppanen et al., "Measurement of the degree of temporal coherence of unpolarized light beams", Photonics Research, vol. 5, No. 3, Jun. 2017, pp. 156-161 (6 pgs. total).

*Primary Examiner* — Khaja Ahmad
(74) *Attorney, Agent, or Firm* — Aikin & Gallant, LLP (57) ABSTRACT

Display panel stack-up structures are described. In an embodiment, a display panel includes a substrate, a light source, and a multiple layer thin film encapsulation over the light source. In an embodiment, the display panel additionally includes an anti-reflection layer over the light source. In an embodiment, an incoherence layer is located within the thin film encapsulation.

11 Claims, 5 Drawing Sheets

(56) References Cited

U.S. PATENT DOCUMENTS

| | | | |
|---|---|---|---|
| 2014/0049827 A1* | 2/2014 | Fujii | G02B 1/113 |
| | | | 359/586 |
| 2014/0117330 A1* | 5/2014 | Cho | H01L 51/56 |
| | | | 257/40 |
| 2016/0097881 A1* | 4/2016 | Yang | H01L 51/5281 |
| | | | 359/488.01 |
| 2017/0357101 A1* | 12/2017 | Tervo | G02B 27/0081 |
| 2018/0067232 A1* | 3/2018 | Tan | G02F 1/13363 |
| 2020/0183079 A1* | 6/2020 | Leister | G03H 1/2294 |

* cited by examiner

INCOHERENT THIN FILM ENCAPSULATION FOR DISPLAY

RELATED APPLICATIONS

This application claims the benefit of priority from U.S. Provisional Patent Application Ser. No. 62/735,534 filed on Sep. 24, 2018, the full disclosure of which is incorporated herein by reference.

BACKGROUND

Field

Embodiments described herein relate to emissive displays. More particularly, embodiments relate to thin film encapsulation layers of a display panel stack-up.

Background Information

In conventional organic light emitting diode (OLED) displays, thin film encapsulation (TFE) is immediately adjacent to the OLED, affecting device efficiency, color gamut, and off axis color. The difficulties in precise control of TFE thickness cause different types of display imperfections including loss of efficiency, off-axis color variation from normal viewing direction, non-uniformity of display color/luminance, and display-to-display variation during mass production.

Conventional OLED display panel stack-ups often include a thin film transistor (TFT) substrate, OLED, and TFE. The OLED includes an anode, organic layers, and cathode. The TFE may include multiple layers over the OLED to protect against air and moisture.

SUMMARY

Display panel stack-up configurations are described in which the light source can be characterized as having a coherence length within the display panel. The display panel stack-ups in accordance with embodiments may achieve an incoherent TFE and reduce the tendency for interference effects.

In an embodiment, a display panel includes a substrate, a light source over the substrate, a multiple layer TFE over the light source, and an anti-reflection layer over the light source with the anti-reflection layer being within a coherence length of the light source within the display panel.

The anti-reflection layer may be within the multiple layer TFE. The light source may be characterized by a coherence length, with the anti-reflection layer located at a terminal end of the coherence length. In an embodiment, the TFE includes a capping layer, a first passivation layer over the capping, and a second passivation layer over the first passivation layer. In one implementation the anti-reflection layer is immediately adjacent the first passivation layer. The anti-reflection layer may be located over or underneath he first passivation layer. In an embodiment the anti-reflection layer has a graded refractive index.

In an embodiment, a display panel includes a substrate, a light source over the substrate, and a multiple layer TFE over the light source. The light source may be characterized by a coherence length, with a terminal end of the coherence length located within an incoherence layer of the multiple layer TFE characterized by an optical thickness greater than 2 µm. For example, the incoherence layer may be a single layer or multiple layers with a maximum refractive index mismatch of 0.05 or less.

In an embodiment, the multiple layer TFE includes a capping layer, a first passivation layer over the capping layer, and a second passivation layer over the first passivation layer, where the incoherence layer is a buffer layer located between the capping layer and the first passivation layer. In an embodiment, the buffer layer is thicker than the capping layer and the first passivation layer.

In an embodiment, the multiple layer TFE includes a capping layer, a first passivation layer over the capping layer, and a second passivation layer over the first passivation layer, where the incoherence layer is the capping layer. In an embodiment, the capping layer is thicker than the first passivation layer, and the capping layer is formed of an organic material.

In an embodiment, the multiple layer TFE includes a capping layer, a first passivation layer over the capping layer, and a second passivation layer over the first passivation layer, where the incoherence layer is the first passivation layer. In an embodiment, the first passivation layer is an oxide-based material or nitride-based material, and the first passivation layer is thicker than the capping layer.

In an embodiment, the multiple layer TFE includes a capping layer, a first passivation layer over the capping layer, a particle coverage layer over the first passivation layer, and a second passivation layer over the particle coverage layer. The incoherence layer may include the first passivation layer and the particle coverage layer, where the first passivation layer and the particle coverage layer are characterized by a refractive index mismatch of 0.05 or less. In an embodiment, the first passivation layer has a conformal topology, and the particle coverage layer has a conformal bottom surface and a level top surface.

In an embodiment, the multiple layer TFE includes a capping layer, a first passivation layer over the capping layer, a particle coverage layer over the first passivation layer, and a second passivation layer over the particle coverage layer, where the first passivation layer has a physical thickness less than 500 nm, and the incoherence layer is the particle coverage layer. In an embodiment, the first passivation layer has a conformal topology, and the particle coverage layer has a conformal bottom surface and a level top surface.

DETAILED DESCRIPTION

Embodiments describe display panel stack-up configurations to mitigate unwanted color shifts due to interference effects within the display panel. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between" and "on" as used herein may refer to a relative position of one layer with respect to other layers. One layer "above", "over" or "on" another layer in "contact" with another layer may be directly in contact with the other layer or may have one or more intervening layers. One layer "between" layers may be directly in contact with the layers or may have one or more intervening layers.

In one aspect, embodiments describe configurations that may address the adverse impact of the thin film encapsulation (TFE) on OLED display performance. It has been observed that within a display panel the OLED emission has a finite temporal coherence length of several microns. For example, coherence length of a display panel can be measured using a Michelson's interferometer test configuration. As a result, layers and interfaces within one coherence length of the OLED light source can impact the optical modes of the device. Furthermore, thickness variations in the TFE can affect display performance. In accordance with some embodiments the display panel stack-up is modified to achieve an incoherent TFE and reduce the tendency for interference effects, and in particular those at interfaces with the first passivation layer within the TFE since the first passivation layer is close enough to the light source (e.g. OLED stack) to be in the coherence regime. Other passivation layers may be further away in distance, so no longer in coherence. In addition to neutralizing thickness variation effects of the TFE, which can lead to unwanted coloration differences, the disclosed embodiments may also be used to improve the viewing angle properties of the panel. While specific embodiments are described with regard to OLED display panels, embodiments are not so limited an may be applicable to additional light sources that may contain optical cavities, such as liquid crystal displays, emissive micro-LEDs or quantum dot LEDs.

In the following description and drawings, several display panel stack-up variations are described and illustrated. Each variation may be made to a single or multiple layers. As such, the variations may share common layers, which are initially described in detail in with regard to FIG. 1.

Figure 1:
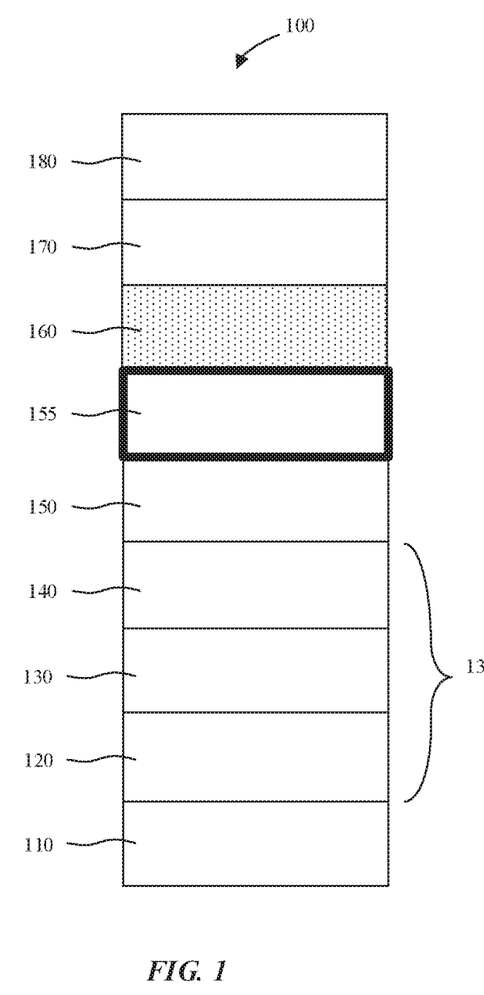
FIG. 1 is a schematic cross-sectional side view illustration of a display panel stack-up including a buffer layer in accordance with an embodiment.

FIG. 1 is a schematic cross-sectional side view illustration of a display panel stack-up including a buffer layer in accordance with an embodiment. As shown, the display panel stack-up 100 may include a substrate 110, such as a thin film substrate (TFT), an anode 120, organic layers 130, and cathode 140. The organic layers 130 may include multiple layers commonly found in an OLED, such as an electron transport layer, organic emission layer, hole transport layer, etc. Alternatively, the organic layer 130 may be substituted with an alternative emission layer, such as a quantum dot layer, or inorganic semiconductor material such as with a micro-LED structure.

The anode 120, organic layers, 130 and cathode 140 together may form the light source 135, or OLED in the particular embodiment illustrated. Anodes 120 may be formed of a variety of electrically conductive materials. In an embodiment, anode 120 is formed of indium-tin-oxide (ITO). For example, ITO may be formed by sputtering or thermal evaporation. In an embodiment, an array of anodes 120 is sputtered onto a substrate 110 and patterned using photolithography techniques in general, with a separate anode 120 formed in each LED of a pixel. Anodes 120 may also be reflective. For example, anodes may include ITO/silver/ITO stacks. Cathode 140 may be formed of a variety of electrically conductive materials, including transparent or semi-transparent materials. In accordance with some embodiments, separate cathodes are formed for respective subpixels. In accordance with embodiments, the cathode 140 may be a common layer shared by multiple subpixels within a pixel and may be a common layer across multiple pixels. In an embodiment, cathode 140 is formed of materials such as Ca/Mg, Sm/Au, Yb/Ag, Ca/Ag, Ba/Ag, and Sr/Ag. For example, in a double layer Ca/Mg the Ca layer has a low work-function for electron injection, whereas a Mg capping layer improves electrical conductance of the cathode 140. In an embodiment, cathode 140 is formed by thermal evaporation.

Still referring to FIG. 1, one or more thin film encapsulation (TFE) layers may be formed over the OLED to protect against air and moisture. The TFE may include one or more layers including a capping layer 150, first passivation layer 160, particle coverage layer 170 and second passivation layer 180. For example, the capping layer 150 may be formed of an organic material, and may be less than 100 nm thick. The first passivation layer 160 may be an inorganic material such as silicon oxide, silicon nitride, or silicon oxynitride, for example. Thickness may be approximately 1 µm. An exemplary particle coverage layer 170 may be formed of an organic polymer material with a thickness of 5-10 µm for example. The second passivation layer 180 may be the same material and thickness as the first passivation layer 160.

In the particular embodiment illustrated in FIG. 1, an optically thick buffer layer 155 is added to the stack-up to increase the distance between the light source 135 and first passivation layer 160 so that incoherence is achieved before the first passivation layer 160. For example, in an embodiment with a coherence length of 2-3 µm for an OLED cavity, the buffer layer 155 is characterized by an optical thickness that is greater than the coherence length of the light source 135. In this manner the coherence length terminates within the buffer layer 155 rather than at, or near a layer interface of other layers in the TFE that may be subject to thickness variations within the layer or from panel-to-panel. As used herein, optical thickness is defined as the product of layer thickness and refractive index of the layer. In an embodiment, the buffer layer 155 is characterized by an optical thickness of 2-5 µm. In a particular embodiment, the capping layer 150 is characterized by a refractive index of 1.7-1.8, while the first passivation layer is characterized by a refractive index of 1.5-1.8, and the particle coverage layer 170 is characterized by a refractive index of approximately 1.5.

The buffer layer 155 in accordance with embodiments may be formed of an optically transparent organic or inorganic material such as TeO, ZnS, LiF, and poly(p-xylylene) polymers referred to under the trade name Parylene. For a buffer layer 155 with refractive index of n, the physical thickness of the buffer layer 155 to achieve incoherence maybe larger than Lc/n, where Lc is the coherence length of the OLED emission. In an embodiment, the buffer layer 155 is characterized by a refractive index of 1.5-2.5 and an optical thickness of 2-5 µm. Thus, use of a higher refractive index material may result in a lower layer thickness. In accordance with the embodiment illustrated in FIG. 1, the optical pathlength is pushed further away by the optically thick buffer layer so that process variations in the overlying layers have less impact on device performance.

Figure 2:
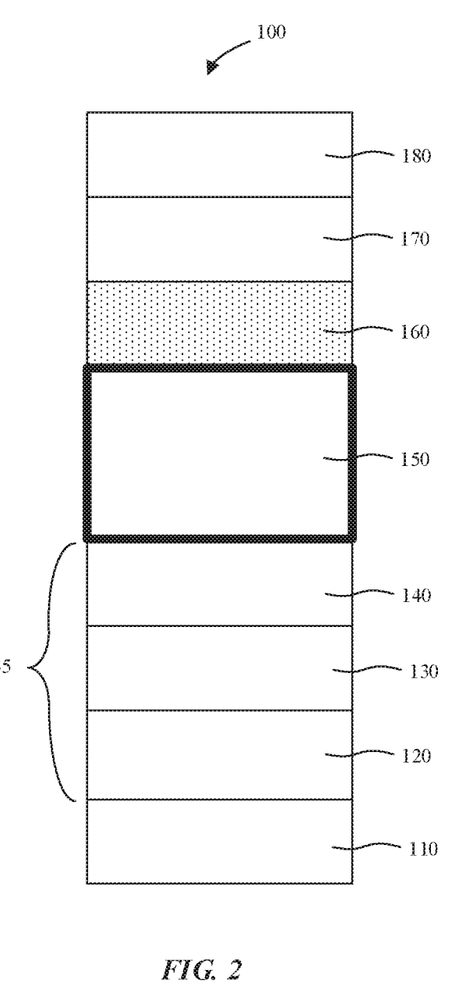
FIG. 2 is a schematic cross-sectional side view illustration of a display panel stack-up including a thickened capping layer in accordance with an embodiment.

Referring now to FIG. 2, a schematic cross-sectional side view illustration is provided of a display panel stack-up 100 including a thickened capping layer 150 in accordance with an embodiment. The display panel stack-up 100 structure is similar to that described with FIG. 1, with the capping layer 150 characterized by an optical thickness of 2-5 µm. In this manner, the optical path length is pushed further away by the optically thick capping layer so that process variations in the overlying layers have less impact on device performance. Thus, incoherence may be achieved before the first passivation layer 160. For a capping layer 150 with refractive index of n, the physical thickness of the capping layer 150 to achieve incoherence may be larger than Lc/n, where Lc is the coherence length of the OLED emission. In an embodiment, the capping layer 150 is characterized by a refractive index of 1.5-2.5 and an optical thickness of 2-5 µm.

Figure 3:
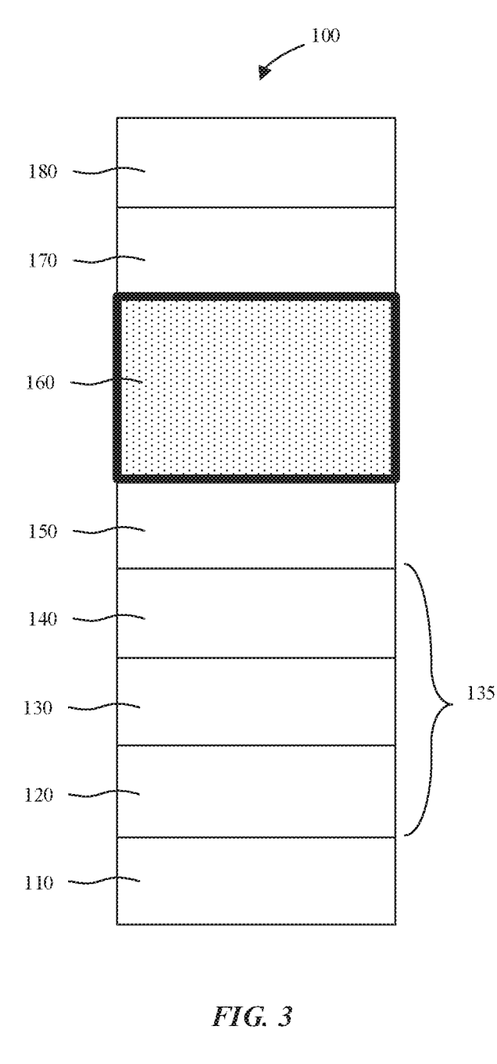
FIG. 3 is a schematic cross-sectional side view illustration of a display panel stack-up including a thickened first passivation layer in accordance with an embodiment.

FIG. 3 is a schematic cross-sectional side view illustration of a display panel stack-up including a thickened first passivation layer 160 in accordance with an embodiment. Similar to the embodiments illustrated in FIGS. 1-2, in the embodiment illustrated in FIG. 3 it is the first passivation layer 160 that is optically thickened. Thus, incoherence may be achieved with the first passivation layer 160. For a first passivation layer 160 with refractive index of n, the physical thickness of the first passivation layer 160 to achieve incoherence may be larger than Lc/n, where Lc is the coherence length of the OLED emission. In an embodiment, the first passivation layer 160 is characterized by a refractive index of 1.5-2.5 and an optical thickness of 2-5 µm. Optical thickness can be as high as 5-10 µm in some embodiments.

Figure 4:
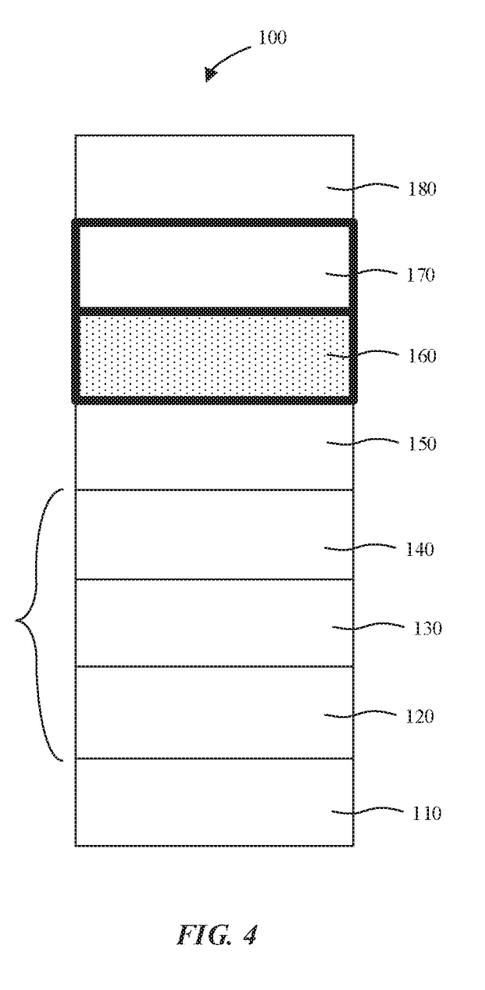
FIG. 4 is a schematic cross-sectional side view illustration of a display panel stack-up including first passivation layer and particle coverage layer with matched indices of refraction in accordance with an embodiment.

Referring now to FIG. 4 a schematic cross-sectional side view illustration is provided of a display panel stack-up including first passivation layer and particle coverage layer with matched indices of refraction in accordance with an embodiment. In an embodiment, the capping layer 150 is first formed over the OLED using a technique such a vacuum evaporation, which may lead to a conformal layer topography. Where the first passivation layer 160 is formed using a chemical vapor deposition (CVD) technique the precursor compositions and deposition parameters may be tuned to match the refractive index with the subsequently formed particle coverage layer 170. Preferably, the refractive index of the particle coverage layer and the first passivation layer is less than 0.05, more preferably less than 0.03, and most preferably less than 0.01. For example, where the first passivation layer 160 is formed of a material such as silicon oxynitride, the oxygen and nitrogen relative compositions can be tuned to match the refractive index (such as within 0.05) with particle coverage layer 170 in the visible wavelength range. In an embodiment, the first passivation layer 160 also has a conformal layer topography. The subsequently formed particle coverage layer 170 may be formed using a solution-based printing or coating technique of a liquid polymer in solution, or a polymer precursor, where the bottom surface is conformal and the top surface is leveled, for example, due to gravity. In such an embodiment, the matched refractive indices of the first passivation layer 160 and particle coverage layer 170 may mitigate impact of the layer interface with the coherence length of the light source. Thus, the coherence length may terminate within the first passivation layer 160 and particle coverage layer 170 combined thickness.

Figure 5:
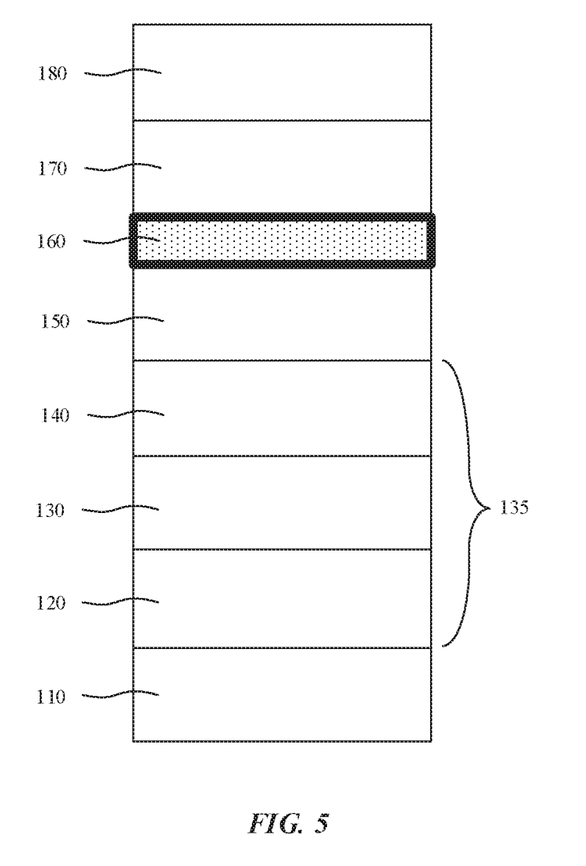
FIG. 5 is a schematic cross-sectional side view illustration of a display panel stack-up including a thin first passivation layer in accordance with an embodiment.

FIG. 5 is a schematic cross-sectional side view illustration of a display panel stack-up including a thin first passivation layer 160 in accordance with an embodiment. In the particular embodiment illustrated in FIG. 5 the first passivation layer 160 physical thickness is kept below 100 nm. In this manner, thickness variation of the first passivation layer 160 (e.g. which can be as much as +/−10% with some application techniques) no longer causes significant optical path impact, and therefore less viewing angle impact.

Figure 6:
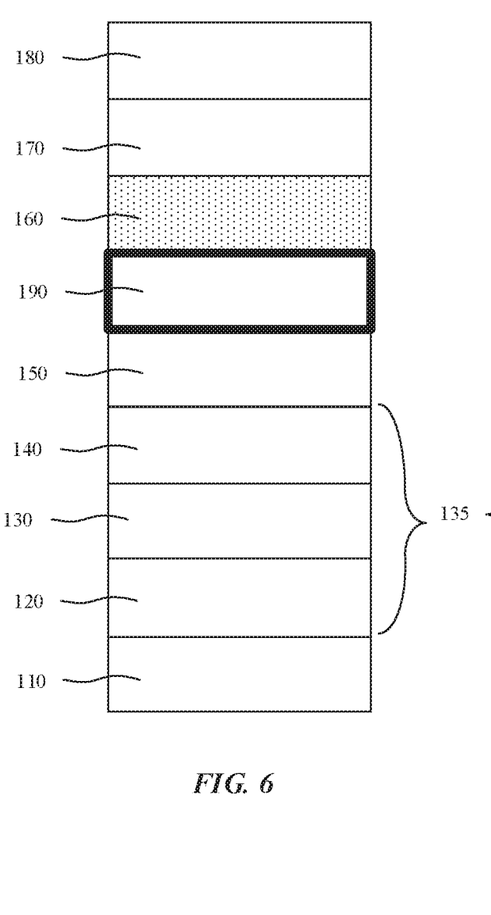
FIGS. 6-7 are schematic cross-sectional side view illustrations of a display panel stack-up including an anti-reflection layer in accordance with an embodiment.
Figure 7:
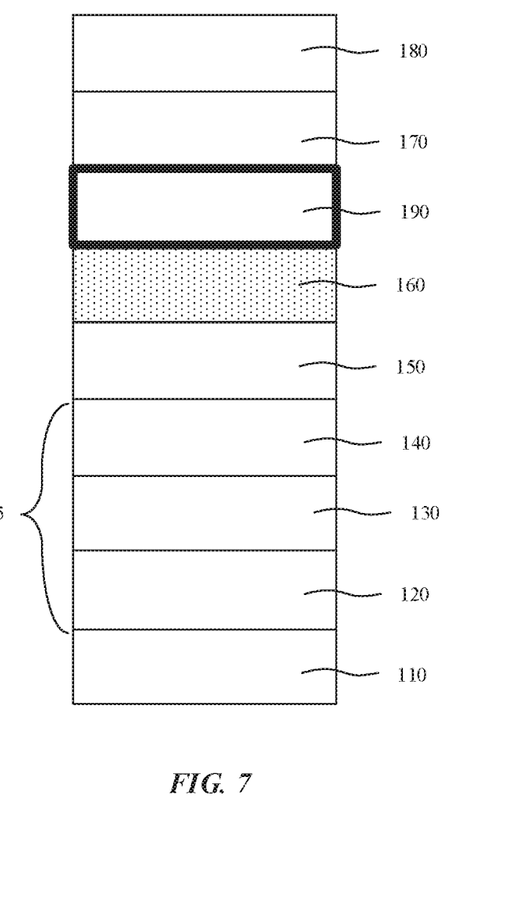

Referring now to FIGS. 6-7 schematic cross-sectional side view illustrations are provided of display panel stack-ups including an anti-reflection layer 190 in accordance with an embodiment. In accordance with the embodiments, an anti-reflection layer is inserted above the upper-most layer of the light source 135 (e.g. cathode 140). The anti-reflection layer 190 may be inserted underneath, or within the TFE layers. The anti-reflection layer 190 can be a single layer or can include multiple layers.

In application, the upper-most layer of the light source 135 (e.g. cathode 140) may be characterized by a thickness $d\_1$ and refractive index $n\_1$. The TFE may include m layers. The bottom-most layer of the TFE (e.g. capping layer 150) is characterized by a thickness $d\_2$ and refractive index $n\_2$, and so on with each additional layer in the TFE characterized by a thickness $d\_3, d\_4 \ldots d\_m$ and refractive index $n\_3, n\_4 \ldots, n\_m$. An anti-reflection layer with only one layer between the $i\_th$ and the $(i+1)\_th$ layers would have an index of $sqrt(n\_i*n\_(i+1))$ and a thickness equal to quarter of the target wavelength of the light source 135. The anti-reflection layer can be a broadband multi-layer, with a quintic or graded index profile. The graded index profile maybe achieved by incorporating nanosized pore structures. The anti-reflection layer 190 may mitigate the impact of thickness variation of the $i\_th$ layer, effectively removing the boundary from the light source cavity. This may weaken the cavity strength of the light source, resulting in a more uniform (Lambertian) distribution of emission as a function of angle.

In accordance with an embodiment, the anti-reflection layer 190 is located within the coherence length of the light source. In the embodiments illustrated the anti-reflection layer 190 may be immediately adjacent the first passivation layer 160 such that the anti-reflection layer 190 is underneath the first passivation layer 160 (FIG. 6) or above the first passivation layer 160 (FIG. 7). The anti-reflection layer 190 may alternatively be located at another location in the TFE stack-up.

Figure 8A:
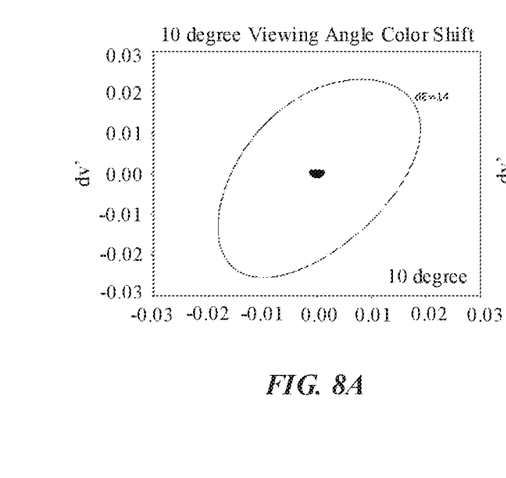
FIGS. 8A-8C are graphs illustrating white color distribution of OLED display panel-to-panel over viewing angle for a stack-up including a coherent first passivation layer.
Figure 8B:
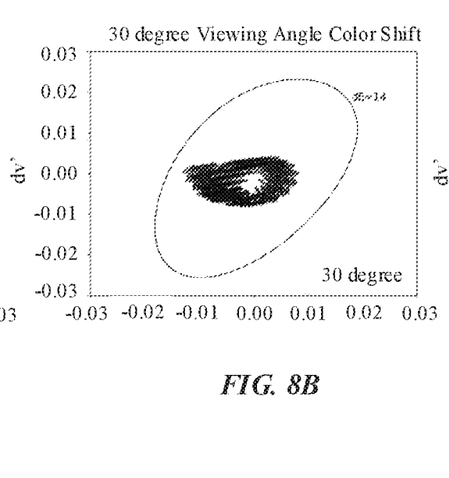
Figure 8C:
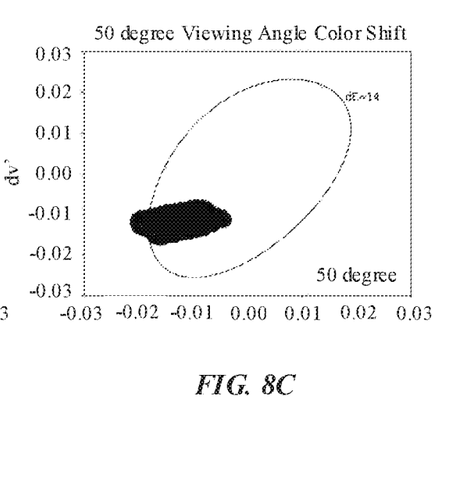
Figure 9A:
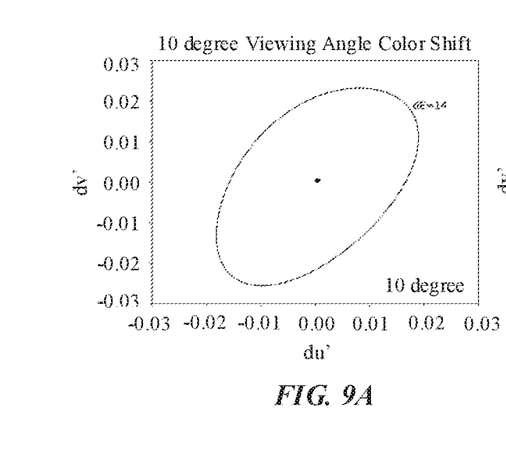
FIGS. 9A-9C are graphs illustrating white color distribution of OLED display panel-to-panel over viewing angle for a stack-up including an incoherent first passivation layer in accordance with an embodiment.
Figure 9B:
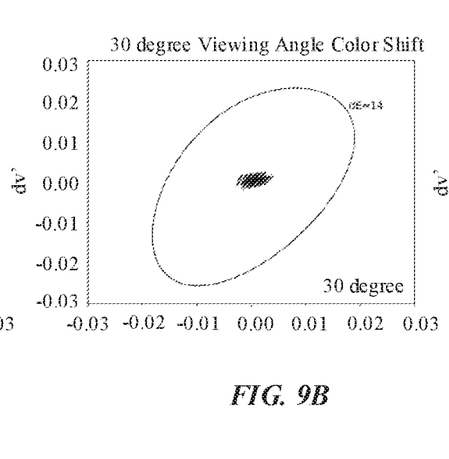
Figure 9C:
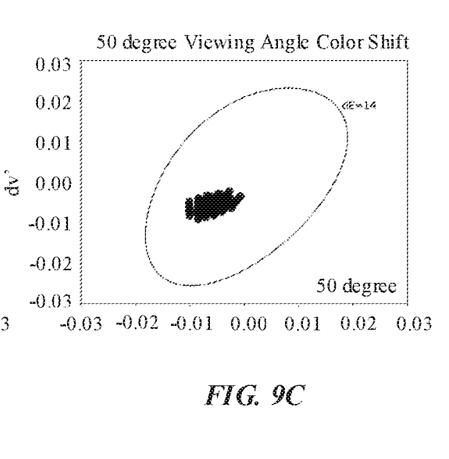

In order to illustrate mitigating the impact of temporal coherence in accordance with embodiments simulation tests were performed to calculate OLED display panel off-axis white color distribution. FIGS. 8A-8C are graphs illustrating white color distribution of OLED display panel-to-panel over viewing angle for a stack-up including a coherent first passivation layer. FIGS. 9A-9C are graphs illustrating white color distribution of OLED display panel-to-panel over viewing angle for a stack-up including an incoherent first passivation layer in accordance with an embodiment. Both simulations presume similar distributions of layer thickness variations both within the panels, and from panel-to-panel. These layer thickness variations typically lead to a range of optical viewing angle behaviors. Specifically, the simulation data provided in FIGS. 9A-9C is for the embodiment illustrated and described with regard to FIG. 3 with a thickened first passivation layer of 8 μm optical thickness, while the data provided in FIGS. 8A-8C is for a similar stack-up structure with a first passivation layer thickness of approximately 1 μm physical thickness. Referring to both FIGS. 8A-8C and FIGS. 9A-9C the spread of data points of the same viewing angles shows the display-to-display variation. It is evident that the incoherent first passivation layer in FIGS. 9A-9C shows significantly reduced display-to-display white color shift variation at 10, 30, and 50 degree viewing angles compared to a coherent first passivation layer.

While the simulation examples of FIGS. 8A-9C are based upon the particular configuration of FIG. 3, it is believed the simulation example additionally validates other embodiments in which various additional structure are integrated to mitigate the impact of temperance coherence of the light source.

In utilizing the various aspects of the embodiments, it would become apparent to one skilled in the art that combinations or variations of the above embodiments are possible for forming a display stack-up which includes structures to mitigate temporal coherence. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A display panel comprising:
   a substrate;
   a light source over the substrate;
   a multiple layer thin film encapsulation over the light source; and
   an anti-reflection layer over the light source, wherein the anti-reflection layer is within a coherence length of the light source within the display panel; and
   wherein the anti-reflection layer is between and immediately adjacent a lower (i_th) layer and an upper ((i+1)_th) layer within the multiple layer thin film encapsulation, the lower (i_th) layer is characterized by a refractive index of $n\_i$, the upper ((i+1)_th) layer is characterized by a refractive index of $n\_(i+1)$, and the anti-reflection layer is characterized by a refractive index of $sqrt(n\_i * n\_(i+1))$.

2. The display panel of claim 1, wherein the multiple layer thin film encapsulation includes:
   a capping layer, wherein the capping layer is the lower (i_th) layer;
   a first passivation layer over the capping layer, wherein the first passivation layer is the upper ((i+1)_th) layer; and
   a second passivation layer over the first passivation layer.

3. The display panel of claim 2, wherein the anti-reflection layer has a graded refractive index.

4. The display panel of claim 2, wherein the anti-reflection layer is located at a terminal end of the coherence length.

5. The display panel of claim 2, wherein the light source is an organic light emitting diode (OLED).

6. The display panel of claim 2, wherein the anti-reflective layer includes a single layer characterized by a thickness equal to one quarter of a target wavelength of the light source.

7. The display panel of claim 2, wherein the capping layer is formed of an organic material.

8. The display panel of claim 2, wherein the first passivation layer is formed of an inorganic material.

9. The display panel of claim 8, wherein the inorganic material is selected from the group consisting of silicon oxide, silicon nitride, and silicon oxynitride.

10. The display panel of claim 2, wherein the second passivation layer is formed of a same material as the first passivation layer.

11. The display panel of claim 2, wherein the anti-reflective layer is a broadband multi-layer.

* * * * *